United States Patent [19]

Urquhart et al.

[11] Patent Number: 4,788,437

[45] Date of Patent: Nov. 29, 1988

[54] TRITIUM LIGHT

[75] Inventors: Donald A. Urquhart; Douglas Hart, both of Toronto, Canada

[73] Assignee: Landus Inc., Campbellville, Canada

[21] Appl. No.: 910,537

[22] Filed: Sep. 23, 1986

[30] Foreign Application Priority Data

Sep. 23, 1986 [GB] United Kingdom ................. 8523422

[51] Int. Cl.$^4$ ........................ H01L 31/04; F21K 2/00

[52] U.S. Cl. .............................. 250/486.1; 250/483.1; 250/487.1; 250/462.1

[58] Field of Search .................. 250/486.1, 483.1, 484, 250/485.1, 487, 488, 462.1, 467.1

[56] References Cited

U.S. PATENT DOCUMENTS

| | | | |
|---|---|---|---|
| 2,749,251 | 6/1956 | Shapiro | 250/487.1 |
| 3,238,139 | 3/1966 | Fischer et al. | 250/462.1 |
| 3,409,770 | 11/1968 | Cladham | 250/462.1 |
| 3,578,972 | 5/1971 | Dooley et al. | 250/462.1 |
| 3,578,973 | 5/1971 | Dooley et al. | 250/462.1 |
| 3,889,124 | 6/1975 | Yamamoto et al. | 250/462.1 |
| 4,230,510 | 10/1980 | Cusano et al. | 250/484.1 |
| 4,488,047 | 12/1984 | Thomas | 250/486.1 |

FOREIGN PATENT DOCUMENTS

| | | | |
|---|---|---|---|
| 2578954 | 3/1985 | France | 250/484.1 |
| 1011235 | 11/1965 | United Kingdom | 250/484.1 |

*Primary Examiner*—Bruce C. Anderson
*Assistant Examiner*—Paul A. Guss
*Attorney, Agent, or Firm*—Sim & McBurney

[57] ABSTRACT

A light assembly comprises a self-luminescent light source, a wave guide and output optics. The self-luminescent light source takes the form of a luminescent concentrator which is activated directly or indirectly by radioactive radiation, typically beta radiation from tritium.

5 Claims, 3 Drawing Sheets

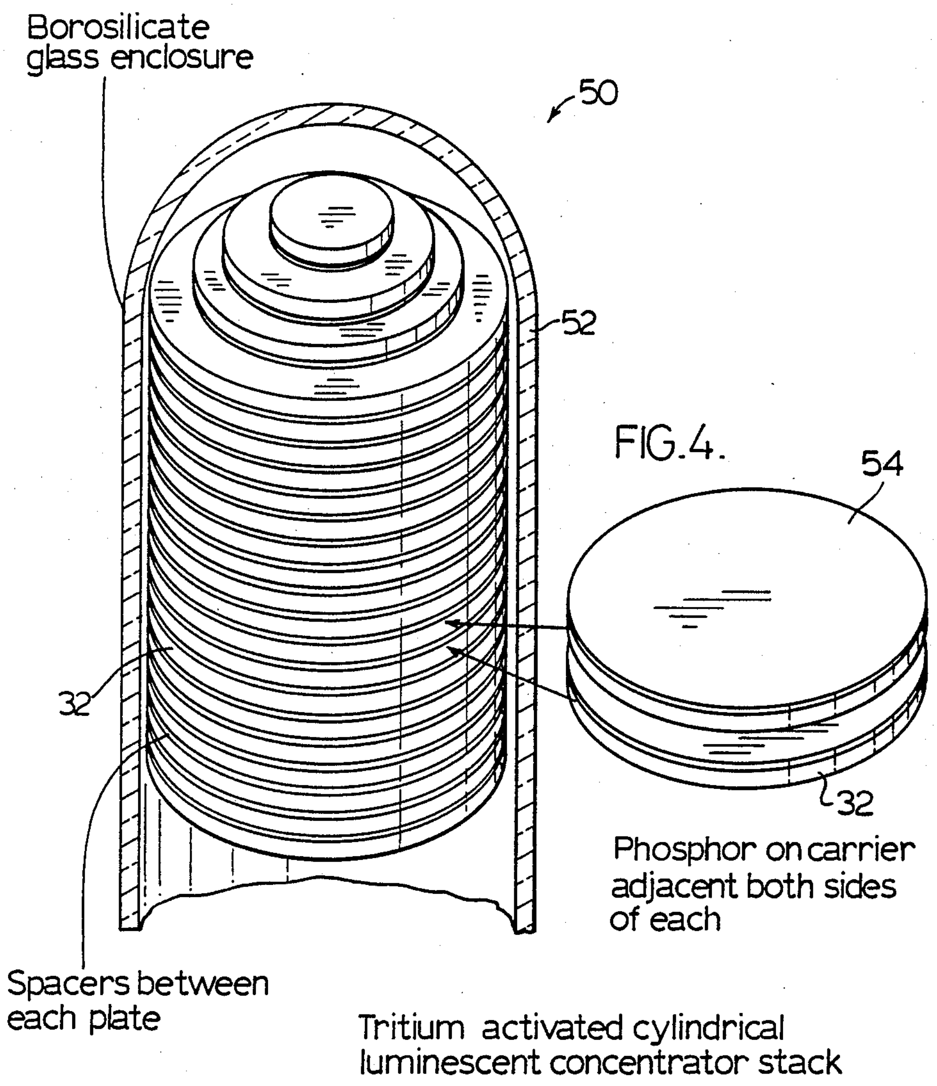
FIG.5.
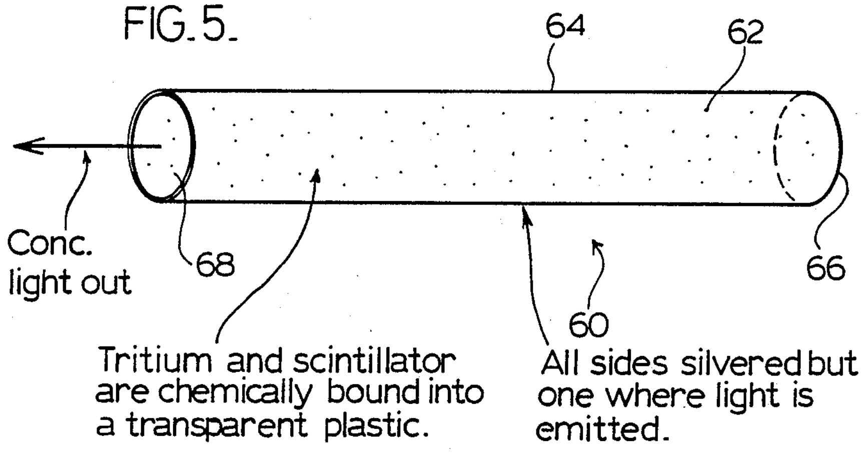

TRITIUM LIGHT

FIELD OF INVENTION

The present invention relates to self-powered light sources and, in particular, to light sources activated by radioactive materials, such as tritium.

BACKGROUND TO THE INVENTION

It is well known that radiation from beta, gamma and other radioactive sources is able to generate light when it strikes certain types of luminescent materials, such as phosphors. The most commonly-used of these radioactive sources is tritium, a weak beta particle emitter.

Conventional luminescent light sources use tritium gas inside a phosphor-coated glass envelope. Typical prior art applications of such light sources are in luminescent safety signs (see, e.g., U.S. Pat. No. 3,409,770), light standards (see, e.g., U.S. Pat. No. 3,889,124), dials and gauges requiring low level high reliability lighting.

A limitation to the extensive use of this technology is that high levels of light intensity are difficult to achieve, owing to the low level of phosphor emissions. Source brightness has remained at relatively low levels, in the range of about 100 to about 800 microlamberts.

In the prior art, concentration of the light has been attempted using reflectors mounted behind the glass tubes. However, this procedure provides no increase in the overall light intensity.

A further problem with the prior art structures is the vulnerability of the enclosure to fracture or breakage and the potential for release of radioactive material. Higher intensity light sources using the conventional structure would require higher levels of radioactivity, thereby increasing the radiation hazard upon fracture or breakage of the enclosure.

SUMMARY OF INVENTION

The present invention seeks to overcome these problems of the prior art to achieve higher source brightness and higher levels of safety.

In the present invention, a novel light generator means is provided which produces intensified levels of light emission from radioactivity excitation of luminescent materials. The light generator means provided herein comprises a luminescent concentrator. A "luminescent concentrator" is a non-imaging concentration device wherein light from a source thereof is concentrated by internal reflection to be emitted from one surface in intensified form. In this way, an increase in overall light intensity is achieved, contrary to the prior art. Further enhancement of the light output may be achieved using heat, an electrical field or other convenient means.

A variety of geometric shapes of luminescent concentrator may be employed, including flat plates, rods, cylinders and a variety of solid shapes.

BRIEF DESCRIPTION OF DRAWINGS

FIG. 4 is a perspective view of a tritium-activated cylindrical concentrator stack provided in accordance with another embodiment of the invention; and FIG. 5 is a perspective view of an alternative form of luminescent concentrator provided in accordance with a further embodiment of the present invention.

GENERAL DESCRIPTION OF INVENTION

Figure 1:
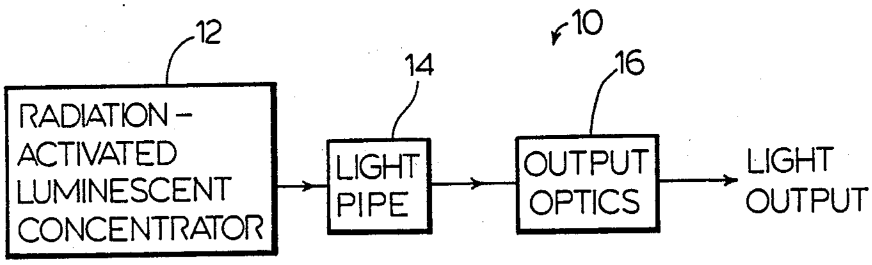
FIG. 1 illustrates, in block diagram form, a light assembly including a luminescent concentrator of the present invention.

The luminescent concentrator used herein may take a variety of forms. In one particular embodiment a planar transparent sheet containing a fluorescent material or dye is employed and is suspended in a tritium atmosphere. A radiation-excitable phosphor material also is supported in the tritium atmosphere closely adjacent to one or both of the faces of the sheet. Light emitted from the supported phosphor material enters the planar transparent sheet or "light pipe" through the faces and excites the luminescent material in the sheet. Light from the luminescent material then is trapped within the sheet by internal reflection produced by a sharp transition of refractive indices at the surfaces and is emitted only at the edges, thereby achieving the light concentration effect. Light may be made to exit from a preferred location by depositing reflecting material on the other areas.

Generally, a plurality of such sheets are stacked together in closely-spaced relation with a series of supported phosphor layers located between each pair of sheets, with tritium gas permeating the space, so as to provide a high intensity light source. The stack may be provided on the top, bottom and three sides with a light-impermeable coating, usually of reflective material, to prevent the escape of light therefrom and to achieve further concentration since the light can escape only from one edge.

In this embodiment, the luminescence of the light source, neglecting losses, is directly proportional to the ratio between the surface area of the phosphor material and the edge surface area. For example, a 100×100 mm sheet (approx. 4"×4"), 1 mm thick, has a total input area ($A_1$) of 20,000 mm$^2$, assuming light enters both faces. If three edges are silvered, the total exit area ($A_2$) is 100 mm$^2$, and the geometric concentration $A_1/A_2$ is 200.

If the area of the plate is increased by a factor of 3, the geometric concentration, at least theoretically, is increased to 600. However, for practical applications, there are limits to the possible concentration and the total system has to be optimized. For a small input area, the efficiency is better but then the concentration factor is low. On the other hand, for very large plates the concentration factor increases but the efficiency drops due to various losses, such as reabsorption and non-ideal characteristics of the transparent sheet.

In actual practice, only about 20% of the light entering a fluorescent concentrator may be absorbed, and losses may amount to a total of about 90%. However, such losses may be more than compensated for by the high concentration effect within the luminescent concentrator. For a 100×300 mm (4"×12") plate, for example, with a geometric concentration of 600, a brightness of an 800 microlamberts phosphor would be theoretically increased to 480,000 microlamberts, assuming no losses. With losses of 90%, however, the actual brightness of the output would be 48,000 microlamberts or still 60 times the brightness of the light emitted directly by the tritium-activated phosphor.

The spacing between the sheets in the stack may be optimized along with the tritium gas pressure to minimize self-absorbtion of tritium and to achieve the maximum luminescence per curie of radioactive tritium gas.

The carrier for the phosphor material may take any desired from. In one aspect, the phosphor may be coated on both sides of a sheet of highly reflective material or of a sheet possessing a geometry configured to optimize transmission from the phosphor.

The carrier sheet may be continuous or permeable. Support for the carrier sheet between the light pipe sheets may be achieved using small spacer, bumps, corrugations or any other similar structure.

The phosphor also may be deposited directly on the outer surfaces of the respective sheets in the stack, but only if an optical coating is first applied which exhibits a sharp cut-off such that it reflects light of the wavelength emitted by the fluorescent dye but transmits light at the phosphor wavelength. If the coating material does not possess these properties, then the internal reflecting properties of the sheet are destroyed and light emitted by the fluorescent dye is absorbed by the phosphor and is lost.

This first embodiment of the invention is described using phosphor materials and fluorescent dyes to generate the light. Other convenient luminescent materials may be employed to achieve the same effect. When using phosphors and fluorescent dyes, various combinations may be employed. Preferably, the fluorescent material exhibits a maximum absorption at the peak output of the phosphor and a maximum emission somewhat displaced in wavelength therefrom, to avoid reabsorption of emitted light by the fluorescent material as the light travels and is guided by internal reflections through the concentrator to the location at which it exits.

In the latter embodiment, the tritium is located external to the luminescent concentrator and concentration of phosphor-emitted light is achieved by receipt of such light through the external surfaces, internal reflection within the sheet and then emission through a side edge. In a second embodiment of the invention, the tritium is located internally of the luminescent concentrator.

In this second embodiment, the tritium is incorporated into the matrix of the luminescent concentrator which contains the luminescent material. Incorporation of the tritium is most conveniently effected by chemical bonding to the matrix material. The radiation then excites the luminescent material, the light from which then is trapped and reflected within the matrix to be emitted from a desired location. Conveniently in this embodiment, the concentrator matrix may be in cylindrical form with the outer surface and one end having a light-impermeable coating, usually of reflective material, to prevent the escape of light from those locations and to concentrate the light to be emitted only from the one end. In this embodiment, the output luminescence is proportional to the ratio of the volume of the matrix to the surface area of the edge where the light is emitted, ignoring absorption losses.

In this second embodiment of the invention, the energy transfer step between luminescent materials employed in the first embodiment is eliminated, thereby providing improved yield and enhanced light output efficiency.

It has previously been suggested in U.S. Pat. No. 3,238,139 to provide a tritium-activated self-luminescent body wherein the tritium is chemically bound in a synthetic resin matrix. However, this prior art nowhere discloses or suggests the provision of a luminescent concentrator in which the tritium is chemically bound.

The tritium may be chemically bound into the concentrator matrix by any convenient procedure. For example, polymerizable monomer containing tritium may first be formed by conventional hydrogenation techniques employing tritium in place of hydrogen and the monomer then may be homopolymerized or copolymerized with another polymerizable monomer to form a solid matrix in which the tritium is chemically bound. The luminescent material may be incorporated into the monomer mix prior to polymerization.

Since the tritium is very strongly bound to the host matrix polymer, there is no need for a vacuum tight enclosure in this embodiment. In addition, the plastic matrix may be formed into any desired configuration, to permit concentration of the light. The strong covalent linkage of the tritium also enhances the safety of the light source since the tritiated material would not be dangerous if the device is broken, but rather would remain chemically bound to its host material. In addition, decay of the tritium produces harmless helium gas, which can easily permeate and escape the matrix in the form of a gas.

An additional benefit of this embodiment lies in the fact that tritium gas may have attraction for vandals and terrorists, since it is an important component in the construction of nuclear weapons. By covalently binding the tritium into a solid matrix as described above, the tritium is no longer in the form of a gas, but rather is diluted by the presence of many chemically identical hydrogen atoms. The problem of isotope separation of the tritium from this mixture is a formidable one, requiring a huge capital investment in equipment, almost equivalent to the costs to produce tritium itself.

The luminescent concentrator may be combined in any convenient manner into an overall light assembly. In one preferred aspect of the invention, the luminescent concentration comprises the light generating element of a three-component assembly which also includes a light guide and a light output assembly. The light emitted from the desired exit location on the luminescent concentrator enters one end of the light guide, which may take the form of a solid or hollow light pipe or fibre-optic bundle, through which it is transmitted to the output optics. In this assembly, the light generator is separated from the output optics, so that tritium gas or other appropriate radioactive material can be contained and protected within a strong and secure enclosure. Further, by separating the light generator from the output optics, it is possible to locate the light source in a position less vulnerable to abuse or accidental fracture. Fracture of the light guide or destruction of the output optical assembly does not lead to the escape of radioactive material, since it remains housed in its enclosure.

A three-component assembly of a light source, a light guide and output optics is not itself novel having regard to the disclosures of U.S. Pat. No. 3,578,973. However, the latter patent does not describe or suggest the utilization of a luminescent concentrator as part of the light source.

Although the disclosure refers specifically to the generation and emission of visible light, the structures described herein and the principles thereof are not limited thereto but may also be configured to emit in any range of the electromagnetic spectrum, including infrared, microwave and radio frequencies, depending on the materials employed. Similarly, radioactive source materials other than tritium may be employed, although the latter is preferred in view of the low levels of radiation involved, the ready availability of tritium, the availability of materials excitable by the radiation emitted therefrom and the harmless and inert nature of the radiation decay product, which is helium.

DESCRIPTION OF PREFERRED EMBODIMENT

Referring to the drawings, FIG. 1 illustrates a three-component light assembly 10 comprising a luminescent concentrator 12, a light pipe 14 and output optics 16. The luminescent concentrator 12 is radiation activated by tritium. If in gaseous form, the tritium gas may be housed, along with the concentrator and any associated phosphor layer, in a secure metal closure to prevent accidental escape.

Light emanates from the closure to the light pipe 14 and thence to the external light output optical assembly 16.

The visual acquisition of a light from a distance depends on its brightness, size and colour. In the present invention, all three can be manipulated by the choice of materials and concentration, as discussed in more detail below. Since the light is transmitted from the concentrator 12 to the optical output 16 by a light guide 14, which may be in the form of a fibre-optic bundle, an electro-optic or mechanical switch, activated by a suitable signal, may be introduced at any convenient location to selectively interrupt light transmission, and thereby switch the light on and off. The prior art tritium lights cannot be switched on and off.

Figure 2:
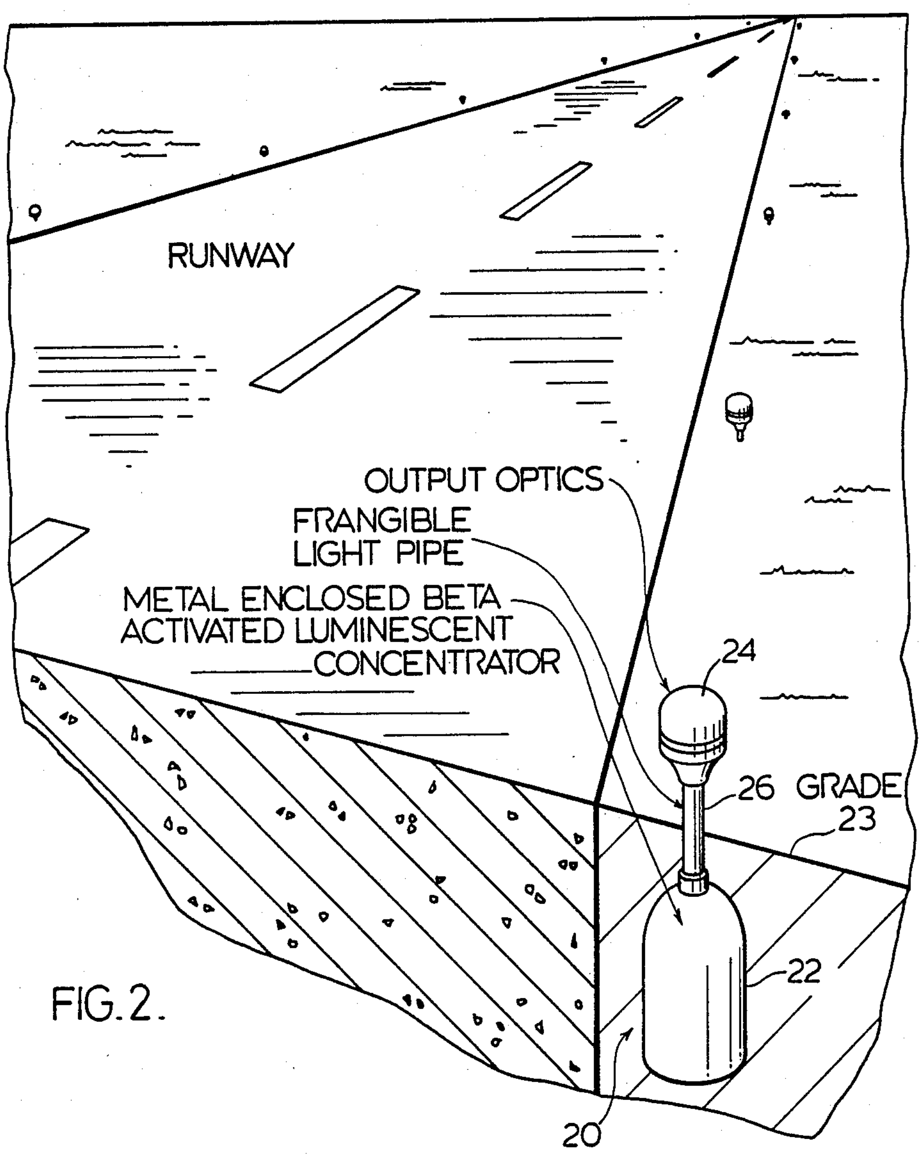
FIG. 2 is a schematic representation of the light assembly of FIG. 1 in the form of runway marker lights.

FIG. 2 illustrates the application of the three-component light assembly of FIG. 1 to a self-activated runway marker light 20, which is representative of a number of similar applications of the luminescent concentrator of the invention. A metal-enclosed light generator 22, corresponding to the tritium-activated luminescent concentrator 12, is buried below the grade and is connected to a light-output optical assembly 24 corresponding to the output optics 16 by a frangible light pipe 26 which may be of any convenient length and which corresponds to the light pipe 14.

The light assembly 20 provides a continuous safe light emission. In the event of accidental impact, on the light the frangible light pipe 26 fractures and breaks away. The metal-encased radioactive source, however, remains unaffected and intact, thereby preventing any escape of tritium gas. A replacement light pipe and optical assembly readily may be attached to the salvaged light generator to restore the light for service.

Figure 3:
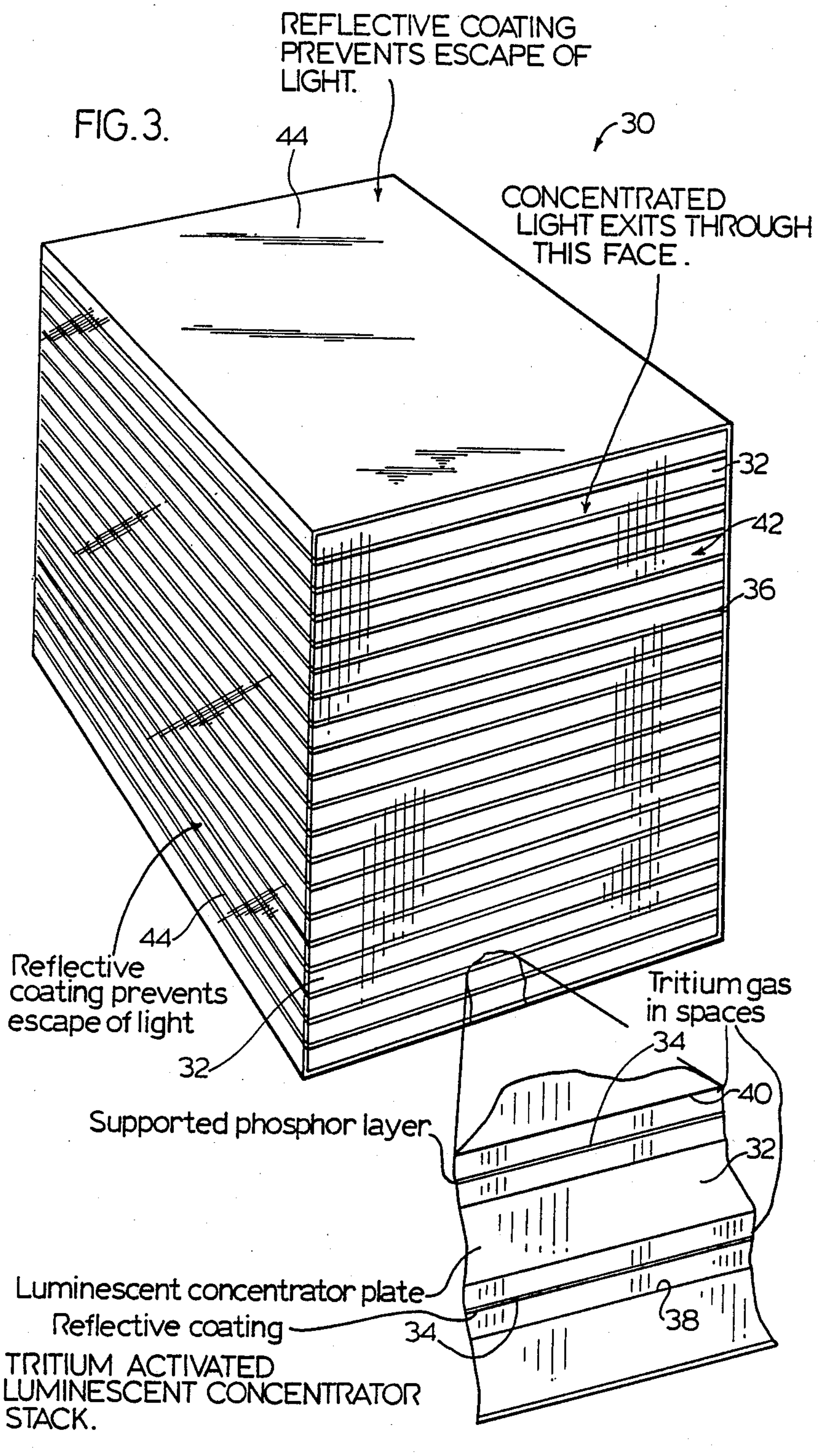
FIG. 3 is a perspective view of a tritium light concentrator stack provided in accordance with one embodiment of the invention.

Specific embodiments of luminescent concentrator provided in accordance with aspects of the present invention and useful in the structures of FIGS. 1 and 2, are illustrated in FIGS. 3, 4 and 5 described below.

The embodiments of FIGS. 3 and 4 are similar and differ in the plate configuration employed therein. In FIG. 3, rectangular plates are used while in FIG. 4 disks are employed. The disk construction is suitable for applications where 360° light distribution is desired.

Referring to FIG. 3, a light source 30 comprises a stack of individual transparent plates 32 containing fluorescent material spaced apart from each other. A substrate 34 bearing phosphor material on both faces is located in the gap 36 between the opposed upper 38 and lower 40 faces of each pair of plates 32. Each of the individual gaps 36 has tritium gas located therein. The stack 30 of plates is located in a suitable enclosure so as to house and prevent escape of the tritium gas. The external surfaces of the stack 30, except for one end face 42, are coated with reflective material 44. Beta ray emission from the tritium gas in the gap 36 causes the phosphor material on the support 34 to emit radiation of a certain range of wavelengths characteristic of the phosphor material, which then enters the adjacent faces of the respective plates 32. The phosphor radiation then excites the fluorescent material in the plate 32 to emit radiation of a different wavelength, characteristic of the particular fluorescent material. Because of the wavelength shift and the sharp transition of refractive index at the surfaces, light from the fluorescent material is transmitted by internal reflection towards the side edges. The reflective coating on three sides ensures that the concentrated light exits each of the plates only at the face 42.

In FIG. 4, the light source 50 is similarly constructed to that illustrated in FIG. 3, except that the individual plates 32 are constructed in the form of disks and light is emitted from all sides of the structure, which is housed in a borosilicate glass enclosure 52.

An advantage of the arrangement illustrated in FIG. 4 is that none of the edges need to be coated with reflecting material. A disadvantage is that the large emitting aperture that results from the disk shape of the plates limits geometric concentration. This effect is shown by calculating the geometric concentration ratios for a disk of diameter D and thickness t, as follows:

$$A_1 = \frac{\pi D^2}{4} = \text{Surface area of face of disk}$$

$$A_2 = 2\pi Dt \text{ (for two sides)} = \text{Surface area of edge of disk}$$

Geometric Concentration $$GC = \frac{A_1}{A_2} = \frac{D}{8t}$$

example: for $D = 100$ mm and $t = 1$ mm $$GC = 12.5$$

The following Table 1 shows the expected brightness of stacks of 1 mm thick disks of different diameters:

TABLE I

| Diameter (mm) | Geometric Concentration $A_1/A_2$ | Optical Efficiency % | Output Brightness microlamberts |
|---|---|---|---|
| 100 | 12.5 | 12 | 1200 |
| 150 | 18.8 | 11 | 1700 |
| 200 | 25.0 | 10 | 2000 |
| 250 | 31.3 | 9 | 2300 |
| 300 | 37.5 | 8 | 2400 |

In the above Table I, optical efficiencies are estimated, based on the measured result for a large sheet (400×400×3 mm) of 8.7 percent, and a phosphor brightness of 800 microlamberts.

In the stacked disk embodiment illustrated in FIG. 4, some light escapes directly from the phosphor-coated surfaces of the disks around their periphery (assuming that the spacing between them is maintained by a central support of small diameter).

Turning now to FIG. 5, there is illustrated another embodiment of luminescent concentrator 100 provided in the present invention. In this case, the light source 60 comprises a tubular body 62, which is a matrix of transparent polymeric material in which tritium is chemically bound along with the luminescent material. The beta radiation from the chemically-bound tritium excites the luminescent material to emit light, which then is reflected internally of the tube 62 towards the ends. The outer surface 64 and one end 66 are coated with highly reflective material, such as silver, to enhance internal reflection and to ensure that light is not lost therethrough. Light emission from the luminescent concentrator 60 then occurs through the non-coated end 68.

The luminescent concentrators illustrated in FIGS. 3, 4 and 5 are preferred embodiments of such devices. Other configurations providing a light intensity concentrating effect also are included within the scope of the invention. For example, the luminescent concentrator may be in the form of a bundle of optical fibres which have been suitably treated. Optical fibres are doped with fluorescent materials and their longitudinal surfaces coated with phosphors, so that, when the phosphors are activated by beta radiation, light is emitted close to the peak absorption wavelength of the fluorescent materials within the fibre and enters the fibre. The light entering the fibre causes luminescence of the fluorescent material, and internal reflection carries this light to the fibre ends.

Bundles of phosphor-coated fibres may be suspended within a sealed enclosure containing tritium gas such that the fibres are closely packed at the point of exit from the enclosure, but are separated one from another within it so that all surfaces are exposed to beta radiation from the tritium gas. Thus, light generated over a very large surface area is both concentrated within the fibres and then transported by the fibres from the sealed container. The fibre bundle emanating from the sealed container may continue as the light guide on to the optical assembly from which the light is finally emitted, as discussed earlier.

SUMMARY OF DISCLOSURE

In summary of this disclosure, the present invention provides a novel light source based on radioactivity-generated luminescence by providing for concentration of the luminescence. Modifications are possible within the scope of this invention.

What we claim is:

1. A self-luminescent light source, comprising:

an enclosure containing tritium gas, a plurality of planar sheets of transparent material provided in a closely spaced apart stack which is positioned in said enclosure, each said planar sheets having a fluorescent material contained therein capable of generating light of a predetermined range of wavelengths upon activation by illumination, and a layer of phosphor material located in each gap defined by an adjacent pair of faces of said sheets in said stack, said phosphor material, upon beta radiation activation from said tritium gas, emitting light of a predetermined range of wavelengths sufficient to illuminate and be absorbed by said fluorescent material and to activate light generation by said fluorescent material.

2. The device of claim 1 wherein each said sheet is rectangular in shape and the outer surfaces of the end sheets of said stack and three sides of the stack are coated with reflective material to prevent loss of light therethrough and to enhance internal reflection of light in the sheets in said stack so that the light is emitted from the uncoated side of the stack.

3. A luminescent concentrator light source, comprising:

an elongate cylindrical structure comprising transparent polymeric material having tritium chemically-bound thereto and a luminescent material activatable to generate visible light by beta radiation produced by said tritium distributed in the matrix of said polymeric material, and a coating of reflective material on an outer surface of said tubular structure and at one end thereof to enhance internal reflection of light produced by said luminescent material for emission of said light from the other end of said tubular structure.

4. The light source of claim 3, in combination with light guide means for guiding light from said source to a remote location, and light emitter means at said remote location for emitting light received from said light source through said guide means.

5. The combination of claim 4 including means for selectively preventing light from passing from said source to said emitter means, whereby light emission from said assembly may be turned on and off.

* * * * *